(12) United States Patent
Rakhovsky et al.

(10) Patent No.: US 10,162,307 B2
(45) Date of Patent: Dec. 25, 2018

(54) SYSTEM AND METHOD FOR GENERATING A LITHOGRAPHIC IMAGE WITH THE USE OF A REFLECTIVE CONCAVE CURVILINEAR SURFACE AND A DIGITAL HOLOGRAM IN A DIVERGING BEAM

(71) Applicants: Vadim Rakhovsky, Rockville, MD (US); Mikhail Borisov, Moscow (RU); Aleksey Shamaev, Moscow (RU); Dmitry Chelyubeev, Dmitrov (RU); Vitaly Chernik, Omsk (RU); Peter Mikheev, Moscow (RU)

(72) Inventors: Vadim Rakhovsky, Rockville, MD (US); Mikhail Borisov, Moscow (RU); Aleksey Shamaev, Moscow (RU); Dmitry Chelyubeev, Dmitrov (RU); Vitaly Chernik, Omsk (RU); Peter Mikheev, Moscow (RU)

( * ) Notice: Subject to any disclaimer, the term of this patent is extended or adjusted under 35 U.S.C. 154(b) by 84 days.

(21) Appl. No.: 15/480,334

(22) Filed: Apr. 5, 2017

(65) Prior Publication Data

US 2018/0292783 A1     Oct. 11, 2018

(51) Int. Cl.
| | |
|---|---|
| *G03H 1/08* | (2006.01) |
| *G03H 1/00* | (2006.01) |
| *G03H 1/22* | (2006.01) |
| *G02B 5/32* | (2006.01) |
| *G03H 1/04* | (2006.01) |
| *G03F 7/20* | (2006.01) |

(52) U.S. Cl.
CPC ............ *G03H 1/0005* (2013.01); *G02B 5/32* (2013.01); *G03F 7/702* (2013.01); *G03F 7/70233* (2013.01); *G03F 7/70408* (2013.01); *G03H 1/0486* (2013.01); *G03H 1/0891* (2013.01); *G03H 1/2205* (2013.01); *G03H 1/2294* (2013.01); *G03H 2001/0094* (2013.01); *G03H 2001/221* (2013.01); *G03H 2222/23* (2013.01); *G03H 2222/52* (2013.01); *G03H 2223/24* (2013.01); *G03H 2226/02* (2013.01)

(58) Field of Classification Search
CPC .......... G02B 5/32; G03H 1/00; G03H 1/0005; G03H 2001/0094; G03H 1/0443; G03H 1/0486; G03H 1/08; G03H 1/0866; G03H 1/0891; G03H 2223/17; G03H 2223/24
USPC ..... 359/1, 9, 22, 32, 33, 35, 15, 16; 355/67, 355/71, 77
See application file for complete search history.

(56) References Cited

U.S. PATENT DOCUMENTS

| | | |
|---|---|---|
| 8,542,421 B2 | 9/2013 | Rosen et al. |
| 9,310,768 B2 | 4/2016 | Rakhovsky |
| 9,323,219 B2 | 4/2016 | Rakhovsky et al. |

(Continued)

*Primary Examiner* — Arnel C Lavarias

(57) ABSTRACT

A system for generating a lithographic image contains a light source that emits a diverging light beam and a reflective concave curvilinear surface onto which the diverging light beam falls and which reflects the diverging beam in the form of a converging beam. A digital hologram, which is placed into a diverging beam between the light source and the reflective surface, is coded in accordance with the lithographic image either preliminarily or dynamically, with the use of a spatial light modulator. From the curvilinear surface the spatially modulated beam is reflected in the form of a converging beam which falls onto an image-receiving substrate that is located in the image restoration plane and on which the lithographic image is generated.

16 Claims, 5 Drawing Sheets

(56) References Cited

U.S. PATENT DOCUMENTS

| | | | |
|---|---|---|---|
| 9,952,516 B1* | 4/2018 | Rakhovsky | G03H 1/2286 |
| 2010/0142014 A1 | 6/2010 | Rosen et al. | |
| 2011/0300490 A1 | 12/2011 | Rosen et al. | |
| 2016/0161914 A1* | 6/2016 | Onural | G03H 1/2294 359/9 |
| 2017/0082976 A1* | 3/2017 | Schwerdtner | G03H 1/2205 |

* cited by examiner

SYSTEM AND METHOD FOR GENERATING A LITHOGRAPHIC IMAGE WITH THE USE OF A REFLECTIVE CONCAVE CURVILINEAR SURFACE AND A DIGITAL HOLOGRAM IN A DIVERGING BEAM

FIELD OF THE INVENTION

The present invention relates to the semiconductor industry, in particular, to microlithography, and more specifically to a system and method for generating a lithographic image with the use of a reflective concave curvilinear surface and a digital hologram in a converging reflected beam. More specifically, the above method is based on the use of a stationary digital hologram or a dynamically controlled digital hologram placed in a diverging light beam supplied from the light source in combination with a spherical, semielliptical, or another reflective concave curvilinear second-order surface of a body of revolution.

DESCRIPTION OF THE RELATED ART

Lithography and, in particular, photolithography is a well-known technique in semiconductor and printed circuit board (PCB) manufacture for creating electrical components and circuits. Photolithography involves placing a mask in front of a substrate, which has been covered by a layer of photoresist, before exposing both a mask and a substrate to light. The areas of photoresist that are exposed to light react and change chemical properties. The photoresist is then developed in order to remove either the exposed portions of photoresist for a positive resist or the unexposed portions for a negative resist. The pattern formed in the photoresist allows further processing of the substrate, such as, but not limited to, etching, deposition, or implantation.

Known in the art is a method for synthesis and forming a digital hologram for use in microlithography. This method is disclosed in U.S. Pat. No. 9,310,768 issued on Apr. 12, 2016 to V. Rakhovsky, et al. The method relates to manufacturing a holographic mask capable of producing a lithographic image that contains elements of a sub-wavelength size along with decreased deviations from the original pattern. The original pattern is converted into a virtual electromagnetic field and is divided into a set of virtual cells with certain amplitudes and phases, which are mathematically processed for obtaining the virtual digital hologram. The calculation of the latter is based on parameters of the restoration wave, which is used to produce the lithographic image of a pattern from the mask, and on computer optimization by variation of amplitudes and phases of the set of virtual cells and/or parameters of the virtual digital hologram for reaching a satisfactory matching between the produced image pattern and the original pattern. The obtained virtual digital hologram provides physical parameters of the actual digital hologram that is to be manufactured.

However, U.S. Pat. No. 9,310,768 does not teach how to synthesize the hologram and restoration of an image from the hologram with reference to the shape of the wavefront of the light beams used in virtual and actual manipulations of the optical beams, especially under conditions when the features of the hologram mask are too small for patterning and therefore are beyond the technological abilities of the conventional methods.

These disadvantages were taken into attention in U.S. Pat. No. 9,323,219 issued on Apr. 26, 2016 to V. Rakhovsky. The patent relates to a method of microlithography with the use of divergent/convergent beams for holographic restoration of an image. More specifically, in the calculation of virtual components of the hologram, the method includes a step, wherein as a result of the preliminary divergence of the initial light beam, the entire virtual hologram is increased in proportion to the degree of the divergence of the initial light beam. This facilitate virtual processing of the fine and delicate elements of the virtual hologram. Upon completion of the virtual processing, the final data needed for manufacturing of the actual digital hologram, e.g., on a lithograph, are obtained. The obtained digital hologram is then can multiply used for actual reproduction of the original pattern.

Thus, it has been shown that by controlling parameters of an optical beam, i.e., by controlling diverging/converging of the restoration image beam it becomes possible to efficiently control the degree of reduction/magnification of the final lithographic pattern. However, U.S. Pat. No. 9,323,219 does not teach how the proposed method can be used in lithographical practice.

SUMMARY OF THE INVENTION

The present invention relates to the semiconductor industry, in particular, to microlithography, and more specifically to a system and method for generating a lithographic image with the use of a digital hologram and a semispherical, semielliptical or another concave curvilinear second-order surface of a body of revolution.

For simplicity of the description, only semispherical and semielliptical reflective surfaces will be considered as examples of concave curvilinear second-order surfaces of bodies of revolution.

The description covers four modifications of an optical system with concave curvilinear reflective surfaces, two of which are embodied as spherical reflective surfaces cooperating with a stationary digital hologram and a dynamically controllable digital hologram formed by means of a space light modulator, respectively, and two others are embodies with semielliptical reflective surfaces in cooperation with a stationary digital hologram and a dynamically controllable digital hologram formed by using a space light modulator, respectively.

More specifically, according to one aspect of the invention, the above method is based on the use of a stationary digital hologram placed into a diverging beam emitted from the light source and an optical system that contains a spherical or semielliptical reflective surface or mirror. The advantage of a curvilinear mirror over a flat one is that a plane mirror is absolutely unsuitable for operations with high-aperture beams. This is because in the case of high-aperture beams it is necessary to convert a diverging beam into a converging one, which cannot be achieved with a flat mirror. In fact, a flat mirror surface can be made but the problem associated with diffraction angles of high-aperture beams will remain unsolved.

In the case of a flat mirror surface of a large size the manufacture of a lens needed for forming a converging beam may be essentially more expensive than in the case of a spherical mirror. Aberration errors which occur in the case of a concave curvilinear mirror can be compensated by calculations at a hologram design stage. An elliptical reflective surface is advantageous in that it easier eliminates aberration. Also, since the reference source remains spherical, the scheme with an elliptical mirror will have a lower spatial frequency of the pattern on the mask.

Regarding the use of a digital hologram dynamically controlled with the use of a Spatial Light Modulator (hereinafter SLM), it should be noted that the use of an SLM makes it possible to shorten the production time and optimize the manufacturing process. The use of a scheme with an SLM allows to solve such problems as unpredictable effects of vibrations and thermal deviations on the aberration. As compared to an amplitude modulator, a phase modulator has a significantly higher diffraction efficiency.

DETAILED DESCRIPTION OF THE INVENTION

The present invention relates to the semiconductor industry, in particular, to microlithography, and more specifically to a system and method of forming a lithographic image with the use of digital holograms and an optical system that contains semispherical, semielliptical surfaces, or other concave curvilinear second-order surfaces of bodies of revolution. For simplicity of the description such holographic image formation systems with reflective concave curvilinear surfaces will be further referred to merely as "holographic image formation systems". More specifically, the above systems and methods are based on the use of digital holograms in combination with partially spherical or semielliptical surfaces.

System with Semispherical Reflective Surface and Stationary DH

Figure 1:
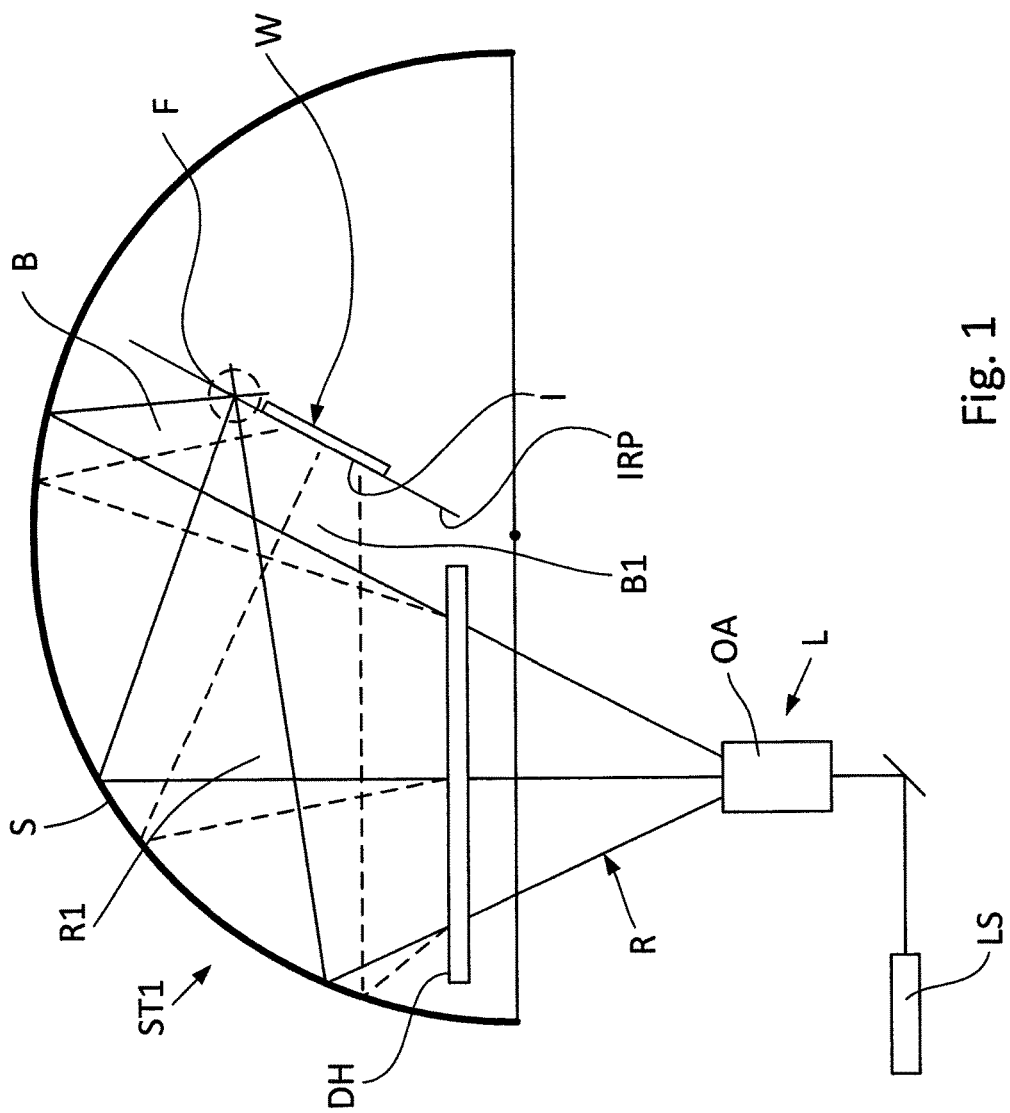
FIG. 1 is a schematic view of the holographic image formation system ST1 of the invention for forming a lithographic image with the use of a stationary digital kilogram (hereinafter DH) and semispherical reflective surface shown in a vertical maximal diametrical cross section.

The main principle of the invention will be better understood with reference to FIG. 1, which is a schematic view of the holographic image formation system ST1 for forming a lithographic image with the use of a stationary DH and a partial spherical reflective surface shown in a vertical maximal diametrical cross section. For convenience of the description the partial spherical surface will be referred to as a spherical surface, although only a portion of the spherical surface is needed for the purposes of the invention.

In the context of the present patent specification, the stationary digital holograms and dynamically controllable hologram of a transparent spatial light modulator (hereinafter referred to as an) SLM in fact represent a lithographic mask that is intended for use in microlithography for manufacturing patterned chips, or the like. Hereinafter, terms stationary digital holograms and dynamically controllable hologram of an SLM will be used in many cases instead of the term "mask".

In FIG. 1, symbol S designates a spherical reflective surface, symbol L designates a light source, DH designates a stationary digital holographic mask formed by the method disclosed in U.S. Pat. No. 9,310,768, and I is an image which is coded in the image-coding optical device such as a stationary DH for forming a code-modulated beam. For convenience of the description, let us first consider a modification with a stationary DH, although the same functions can be accomplished by a dynamically controlled light-transmitting modulator (hereinafter SLM) described below with reference to FIG. 2.

It can be seen that the light source L emits a diverging light beam B, which passes through the stationary hologram DH, is turned into a code-modified beam statically spatially modulated by the coded DH, falls in a code-modulated form onto the inner semispherical reflective surface S, and is then reflected from the inner semispherical reflective surface S in the form of a reflected converging beam R. This converging beam R is focused in the point F, which corresponds to a zero-order conversion of the light beam B that has passed through the stationary hologram DH. The DH-coded image I is formed on an image-receiving substrate, e.g., a semiconductor wafer W, by converted beams of a higher order. One of these high-order conversion beams is shown, e.g., as a first order beam B1, which participates in the formation of the image.

In other words, the system ST1 of the invention has a lithographic image restoration plane IRP, which is located in the path of the converging beam B1, and an image-receiving substrate, e.g., a semiconductor wafer W, which is located in the image restoration plane IRP and on which the lithographic image I is generated. In other words, the converging beam reflected from the reflective concave curvilinear surface carries a coded lithographic image and has an image restoration plane.

In reality, the light source L may be represented by a coherent light laser source LS capable of generating a light beam with a wavelength $\lambda$ and with a coherence length D that exceeds the transverse dimensions of the stationary DH. The light source L also includes an optical assembly OA that emits the aforementioned coherent beam B, which is characterized by high uniformity of the light intensity in a transverse direction. The inner semispherical reflective surface S, which converts the diverging beam B into the reflected converging beam R, should be of high quality, e.g., on the order of surface roughness $\delta$ significantly lower (at least with a factor of 10) than the wavelength $\Delta$. For the simplicity of the drawing, a hologram holder and hologram alignment mechanism are not shown. Also, auxiliary mechanisms such as a substrate W loading/unloading mechanism, etc. are not shown.

As mentioned above, the method for synthesis and formation of a stationary DH for use in microlithography is described in aforementioned U.S. Pat. No. 9,310,768. This patent discloses a method of manufacturing a holographic mask capable of producing an image pattern that contains elements of a sub-wavelength size along with decreased deviations from the original pattern. The original pattern is converted into a virtual electromagnetic field and is divided into a set of virtual cells with certain amplitudes and phases, which are mathematically processed for obtaining a virtual digital hologram. The calculation of the latter is based on parameters of the restoration wave, which is used to produce the image pattern from the mask, and on computer optimization by variation of amplitudes and phases of the set of virtual cells and/or parameters of the virtual digital hologram for reaching a satisfactory matching between the produced image pattern and the original pattern. The obtained virtual digital hologram provides physical parameters of the actual digital hologram that is to be manufactured.

System with Spherical Reflective Surface and DH Dynamically Controlled by Using SLM The above description related to holographic image formation system ST1 with a semispherical reflective surface where the image to be restored was pre-coded in a stationary digital holograms DH. However, in the same system the image-coding function can be accomplished dynamically by using an SLM.

A SLM can form a new hologram for each new pattern. More specifically, a SLM is a dynamically addressable matrix with pixels arranged across the path of the diverged beam for coding of which the matrix is designated.

At the present time, a series of various SLMs is known in the field of holographic image reproduction technique. Some of them are based on controlling a phase, or an amplitude of the passing or reflected light, or on controlling both, the phase and amplitude at the same time. For example, the phase-controlling SLMs are based on a phased array optics that use the technology of controlling the phase of light waves transmitting or reflecting from a two-dimensional surface by means of adjustable surface elements. By dynamically controlling the optical properties of a surface on a microscopic scale, it is possible to control the direction of light beams without any moving parts.

Methods of forming digital holograms with the use of SLMs are known in the art. For example, one such method is disclosed in Published US Patent Application 20040246547 (inventor: Douglas Payne; Publication Date: Dec. 9, 2004). A holographic display comprises an SLM arranged to display a set of tiled holographic images, and illuminating means for illuminating a surface of the SLM. Replay means are provided for focusing light reflected from the SLM surface to present a three-dimensional image. The illuminating means comprises a light source appearing substantially at a DC spot position of the replay means.

Typically, a computer-generated hologram involves a generation of a matrix of data values (each data value corresponding to a light transmission level) which simulates the hologram which otherwise might be formed on a real planer surface. The matrix is applied to an SLM which may be, for example, a two-dimensional array of liquid crystal elements or of acousto-optic modulators. A coherent light is directed onto the SLM using, e.g., a laser such that the resulting output, which is either reflected from the SLM or transmitted through the SLM, is a modulated light pattern. An example of a SLM is an Electrically Addressable SLM (EASLM).

Figure 2:
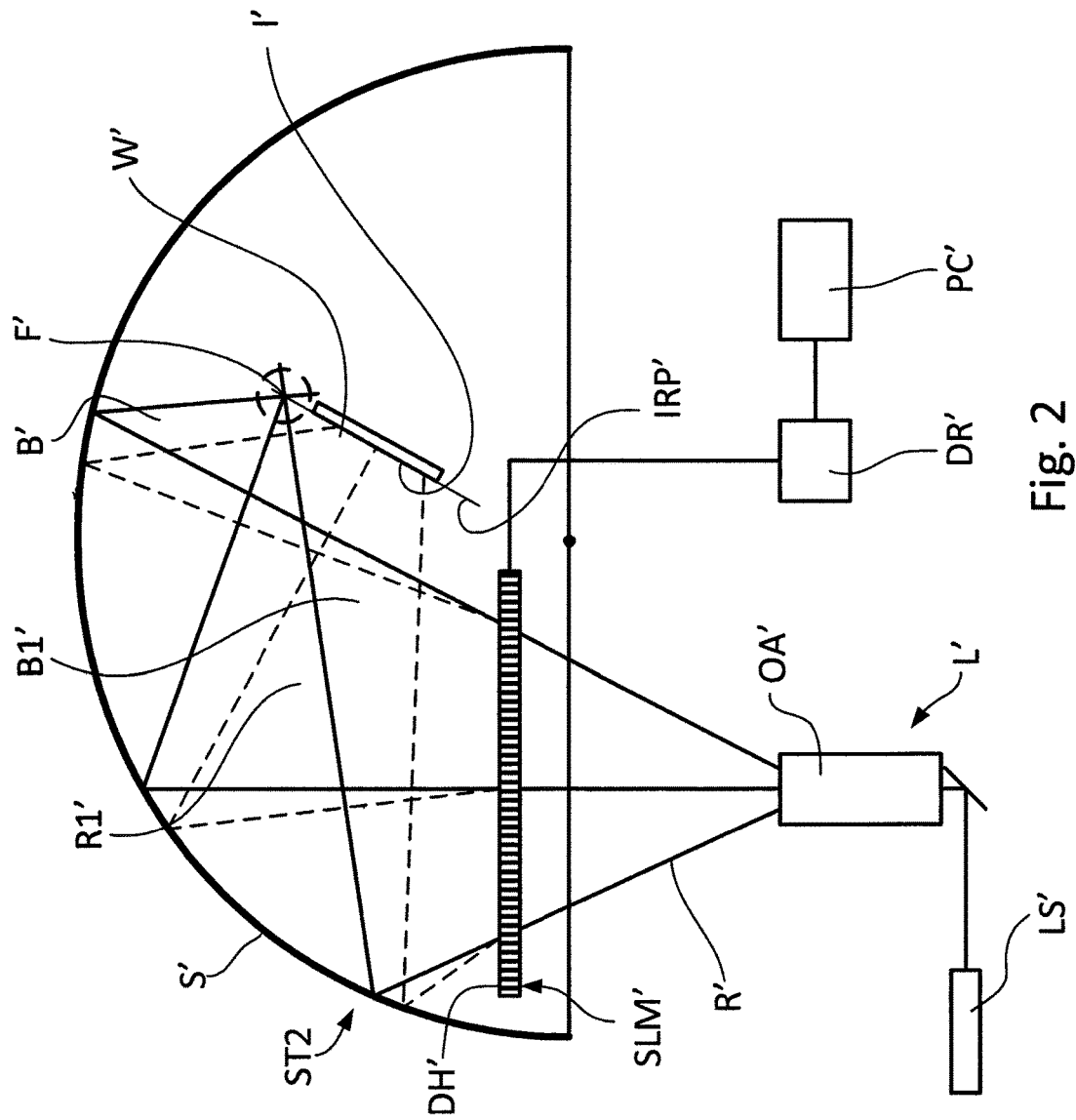
FIG. 2 is a schematic view of the holographic image formation system ST2 of the invention for forming a lithographic image with the use of a semispherical reflective surface shown in a vertical maximal diametrical cross section, the dynamically DH' being formed by using a SLM'.

FIG. 2 is a schematic view of the holographic image formation system ST2 for forming a lithographic image with the use of a semispherical reflective surface shown in a vertical maximal diametrical cross section, the dynamically controlled DH' being formed by using a SLM'.

In this drawing, the elements and components which are similar to those of FIG. 1 are designated by the same symbols with an addition of a prime. For example, the light source will be designated as L', the spherical surface will be designated as S', a SLM' is one that is used for dynamically forming a digital hologram DH', and I' is an image which is coded in the image-coding SLM'.

It can be seen from FIG. 2 that the light source L' emits a diverging light beam B' which passes through the image-coding hologram DH' formed in the dynamically controlled SLM' and falls onto the spherical reflective surface S'. The beam B' is then reflected from the spherical reflective surface S' in the form of a reflected converging beam R' which is focused in the point F', which corresponds to a zero-order conversion of the light beam B1' that passed through the image-coding hologram DH'. The DH'-coded image I' is formed on a substrate, e.g., a semiconductor wafer W', by converted beams of higher order. One of these high-order conversion beams, is shown as a beam B1' which participates in the formation of the image.

In other words, the system ST2 of the invention has a lithographic image restoration plane IRP, which is located in the path of the converging beam B1', and an image-receiving substrate, e.g., a semiconductor wafer W', which is located in the image restoration plane IRP' and on which the lithographic image I' is generated.

Similar to the system ST1 shown in FIG. 1, the light source L' may be represented by a coherent light laser source capable of generating a light beam with a wavelength $\lambda'$ and with a coherence length D' that exceeds the transverse dimensions of the DH'. The light source L' also includes an optical assembly OA' that emits the aforementioned coherent beam B', which is characterized by high uniformity of the light intensity in a transverse direction. The inner semispherical reflective surface S', which converts the diverging beam B' into the reflected converging beam R', should be of high quality, e.g., on the order of surface roughness $\delta'$ much lower than the wavelength $\lambda'$.

In FIG. 2, symbol PC' designates a central processing unit or a computing device, e.g., a computer, which controls operation of a driver DR', which sends optical commands for coding the SLM' in accordance with the image I' to be reproduced on the wafer W'.

System with Elliptical Reflective Surface and Stationary Digital Hologram

Figure 3:
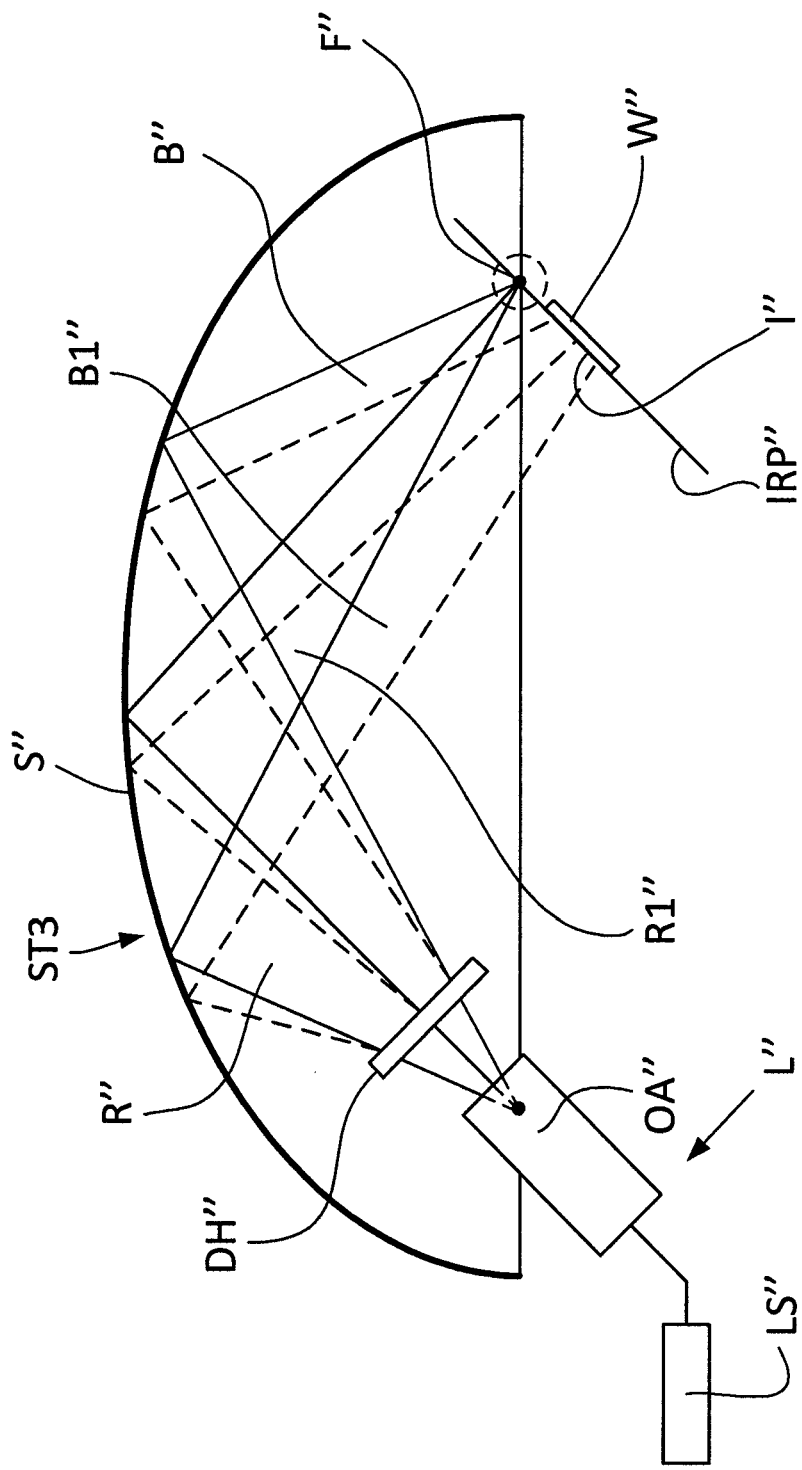
FIG. 3 is a schematic view of the holographic image formation system ST3 of the invention for forming a lithographic image with the use of a stationary DH" and a semielliptical reflective surface shown in a vertical maximal diametrical cross section.

The above description related to holographic image formation systems ST1 and ST2 with the spherical reflective surfaces S and S'. The situation will be different for a holographic image formation system ST3 with an elliptical reflective surface S". The main principle of the invention for the holographic image formation system ST3 with an elliptical reflective surface S" and with a stationary digital hologram H" is shown with reference to FIG. 3, which also is a vertical maximal diametrical cross section of an elliptical body. In this drawing, symbols that correspond to similar components of the semispherical reflective surface S or S' of FIG. 1 or FIG. 2, respectively, are the same but with an addition of two primes. For example, symbol L" designates a light source, DH" designates a digital hologram formed by the method disclosed in U.S. Pat. No. 9,310,768, and I" is an image which is coded in the image-coding optical device such as a DH".

It can be seen that the light source L" emits a diverging light beam B" which passes through the image-coding hologram DH" and falls onto the semielliptical reflective surface S" and is then reflected from the semielliptical reflective surface S" in the form of a reflected converging beam R" which is focused in the point F''', which corresponds to a zero-order conversion of the light beam B1" that passed through the image-coding hologram DH". The DH"-coded image I" is formed on a substrate, e.g., a semiconductor wafer W", by converted beams of a higher order. One of these high-order conversion beams is shown as a beam B1" which participates in the formation of the image I".

In other words, the system ST3 of the invention has a lithographic image restoration plane IRP" which is located in the path of the converging beam B1" and an image-receiving substrate, e.g., a semiconductor wafer W", which is located in the image restoration plane IRP" and on which the lithographic image I" is generated.

Similar to the system ST1 shown in FIG. 1, the light source L" may be represented by a coherent light laser source capable of generating a light beam with a wavelength λ' and with a coherence length D" that exceeds the transverse dimensions of the DH". The light source L" also includes an optical assembly OA" that emits the aforementioned coherent beam B", which is characterized by high uniformity of the light intensity in a transverse direction. The inner semispherical reflective surface S", which converts the diverging beam B" into the reflected converging beam R", should be of high quality, e.g., on the order of surface roughness δ" much lower than the wavelength λ".

Figure 4:
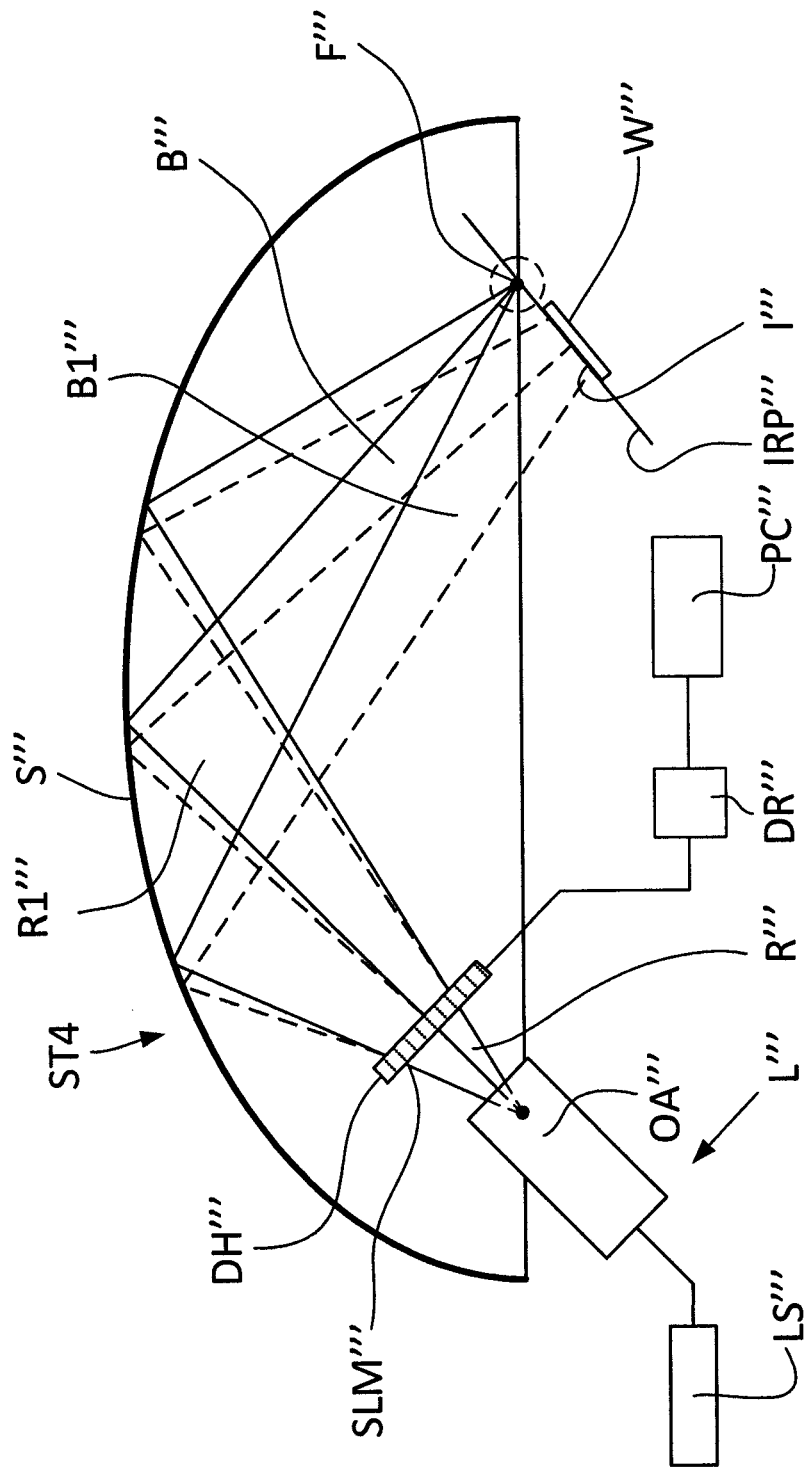
FIG. 4 is a schematic view of the holographic image formation system ST4 of the invention for forming a lithographic image with the use of a semielliptical reflective surface shown in a vertical maximal diametrical cross section, the dynamically controlled DH'" being formed by using a SLM'".

System with Elliptical Reflective Surface and Dynamically Controlled DH Formed by Using SLM FIG. 4 is a vertical maximal diametrical cross section of an elliptical body of an optical holographic image formation system ST4 with an elliptical reflective surface used in conjunction with DH''' dynamically formed with the use of an SLM'''. In this drawing, symbols that correspond to similar components of the semispherical reflective surface S' or S" of FIG. 1 or FIG. 2, respectively, are the same but with an addition of three primes. For example, symbol L''' designates a light source, DH''' designates a digital hologram formed by the method disclosed in U.S. Pat. No. 9,310,768, and I''' is an image which is coded in the image-coding optical device such as a DH'''.

It can be seen that the light source L''' emits a diverging light beam B''' which passes through the image-coding hologram DH''', is coded by the DD''', falls onto the semielliptical reflective surface S''', and is then reflected from the semielliptical reflective surface S''' in the form of a reflected converging beam R''' which is focused in the point F''', which corresponds to a zero-order conversion of the light beam B1''' that has passed through the image-coding hologram DH'''. The DH'''-coded image I''' is formed on a substrate, e.g., a semiconductor wafer W''', by converted beams of a higher order. One of these high-order conversion beams is shown as a beam B1''' which participates in the formation of the image I'''.

In other words, the system ST4 of the invention has a lithographic image restoration plane IRP''' which is located in the path of the converging beam B1''' and an image-receiving substrate, e.g., a semiconductor wafer W''', which is located in the image restoration plane IRP''' and on which the lithographic image I''' is generated.

Similar to the system ST1 shown in FIG. 1, the light source L''' may be represented by a coherent light laser source capable of generating a light beam with a wavelength λ''' and with a coherence length D''' that exceeds the transverse dimensions of the DH'''. The light source L''' also includes an optical assembly OA''' that emits the aforementioned coherent beam B''', which is characterized by high uniformity of the light intensity in a transverse direction. The inner semispherical reflective surface S''', which converts the diverging beam B''' into the reflected converging beam R''', should be of high quality, e.g., on the order of surface roughness δ'''' much lower than the wavelength λ''''.

In FIG. 4, symbol PC''' designates a computing device, e.g., a computer, which controls operation of a driver DR''', which sends optical commands for coding the SLM' in accordance with the image I''' to be reproduced on the wafer W'''.

Figure 5:
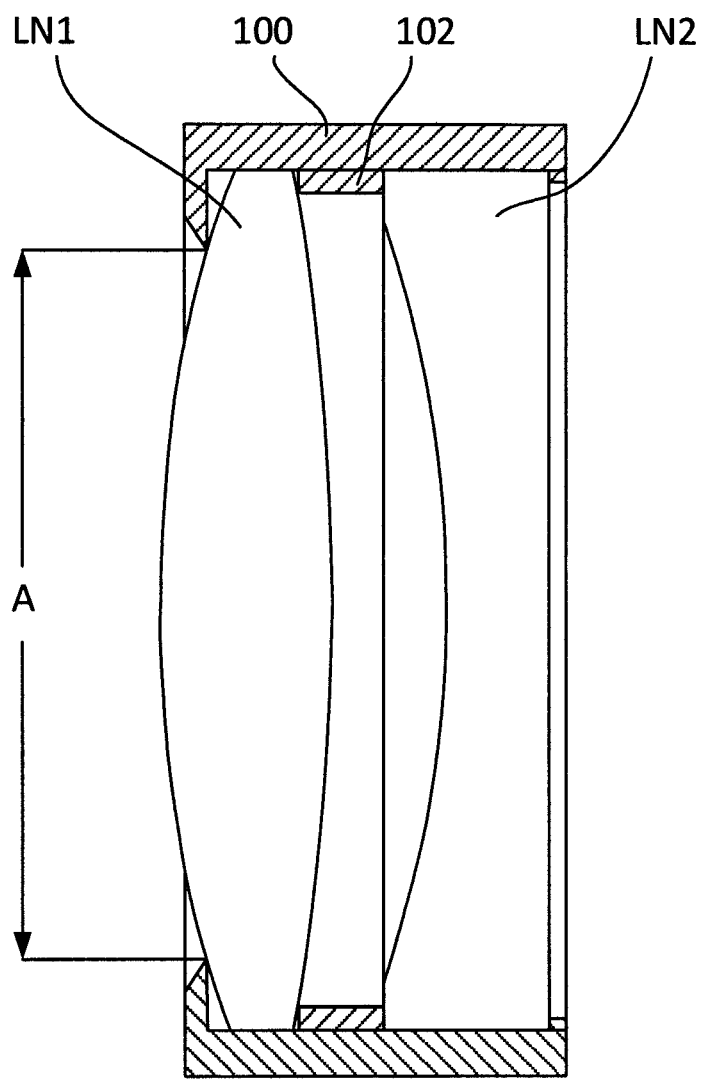
FIG. 5 is an example of a lens assembly for the formation of a diverging beam in a holographic system for lithographic imaging.

Len Assembly for Forming a Diverging Beam in a Holographic System for Lithographic Imaging An example of a lens assembly for the formation of a diverging beam in a holographic system for lithographic imaging is shown in FIG. 5. As can be seen, the lens assembly suitable for this purpose comprises an aperture A formed in an annular body 100 of the assembly and two lenses LN1 and LN2, which are spaced from each other by an annular spacer 102. The aperture A cuts the peripheral part of the beam thus separating the part of the beam BM having the most uniform distribution of the light intensity. Since conventional lenses such as the lenses LN1 and LN2 may lead to an additional non-uniformity in light intensity, these lenses may be aspherical. The unevenness in the intensity of the reconstructed beam is not a big problem per se since this problem can be solved at a design stage at mask calculation, e.g., by intensifying illumination on the peripheral part of the lens. A more serious problem may be caused by an error in positioning of the mask with respect to the source of illumination when the center of symmetry of the Gaussian distribution is shifted with respect to the mask center. The relevant calculations were carried out for the decrease in beam intensity toward the hologram edge with a ratio of 0.2. It is understood that in this case a tolerance for displacement of the non-uniform beam center relative to the center of the mask will depend on the degree of non-uniformity.

Advantages/Disadvantages of Various Modifications

The advantage of a spherical mirror over a flat one is that it is less expensive to manufacture. Most importantly is that a plane mirror is absolutely unsuitable for operations with high-aperture beams. This is because in the case of high-aperture beams it is necessary to convert a diverging beam into a converging one, which cannot be achieved with a flat mirror. In fact, a flat mask working in a reflection mode can be made but the problem associated with diffraction angles of high-aperture beams will remain unsolved. In the case of a flat hologram mask of a large size the manufacture of a lens needed for forming a converging beam may be essentially more expensive than in the case of a spherical mirror.

However, the use of a spherical mirror will lead to occurrence of inevitable spherical aberration. It would be possible to neutralize and correct such aberration errors at a hologram design stage. Furthermore, in the case of a spherical mirror the impact of adverse diffraction of higher orders will grow. According to the present invention these problems can be solved by placing an additional aspherical lens between the mask and the light source.

A holographic mask on an elliptical surface is advantageous in that it eliminates spherical aberration. Also, since the reference source remains spherical, the scheme with an elliptical mirror will diminish the spatial frequency of the pattern on the mask.

Regarding the use of a dynamically controlled SLM, it should be noted that the use of an SLM makes it possible to reduce the production time and optimize the manufacturing process. The use of a scheme with a dynamically controlled SLM allows to solve such problems as unpredictable effects of vibrations and thermal deviations on the aberration.

As compared to an amplitude modulator, a phase modulator has a significantly higher diffraction efficiency. This is because, a phase modulator provides some redistribution of the light energy in terms of diffraction, although some additional noises may occur. However, this drawback is compensated by 3 to 5 fold increase in light energy.

The an effect of aberration on the lithographic image caused by the use of the reflective concave curvilinear surface can be diminished by taking it into account in a transmission function of the static DH or a dynamically controllable DH on the SLM. For this purpose, the transmission function of the digital hologram DH (transparency distribution of the hologram) is calculated as an interference pattern of the object wave emitted by the virtual image I' and a reference wave that is the conversion of the restoration wave B used to illuminate the digital hologram (mathematically this is interpreted as complex conjugation).

Let $(\xi,\eta)$ are coordinates on the hologram plane, $O(\xi,\eta)$ is a complex amplitude of the reference wave on the hologram plane, and $\Pi(\xi,\eta)$ is a complex amplitude of the object wave emitted by the virtual image I'. In this case, transmission function of an amplitude digital hologram can be expressed as $T(\xi,\eta)=|O(\xi,\eta)+\Pi(\xi,\eta)|^2/|O(\xi,\eta)|^2$, where $$T(\xi,\eta)O^*(\xi,\eta) = \frac{(|O(\xi,\eta)|^2+|\Pi(\xi,\eta)|^2)O^*(\xi,\eta)}{|O(\xi,\eta)|^2} + \frac{\Pi(\xi,\eta)O^{*2}(\xi,\eta)}{|O(\xi,\eta)|^2} + \Pi^*(\xi,\eta).$$

(where * designates the complex conjugation).

The resulting wave can be decomposed into three components:

1. In the case of a spherical reference wave and a square hologram, $$\frac{(|O(\xi,\eta)|^2+|\Pi(\xi,\eta)|^2)O^*(\xi,\eta)}{|O(\xi,\eta)|^2}$$

Corresponds to a bright light spot representing the result of diffraction (so-called, zero order) at the edges of the digital hologram and having a shape of a cross in the case of a rectangular digital hologram.

2.

$$\frac{(|O(\xi,\eta)|^2+|\Pi(\xi,\eta)|^2)O^*(\xi,\eta)}{|O(\xi,\eta)|^2}$$

corresponds to an image located in the region approximately symmetrical to the object relative to the focus of the restoration wave. This image may resemble the central reflection of an object.

3. $\Pi^*(\xi,\eta)$ is a field which is conjugated to the object field and corresponds to the object image.

In the case when the digital hologram is located between the mirror and the source of the restoration wave (light source L), the reference wave field is described by the following function:

$$O(\xi,\eta)=A(x(\xi,\eta),y(\xi,\eta),z(\xi,\eta))*e^{-i\varphi(x(\xi,\eta),y(\xi,\eta),z(\xi,\eta))}$$

where $(x,y,z)$ are spatial coordinates and where $A(x,y,z)$ and $\varphi(x,y,z)$ are the amplitude and phase of the restoration wave B, e.g., a spherical wave. The field of the object wave is searched by the formula $$\Pi(\xi,\eta) = \int\int_H \frac{e^{ik(r_1+r_2)+i\pi}}{r_1+r_2} u(x_2,y_2,z_2)dx_2dy_2dz_2$$

where $u(x,y,z)$ is the field that describes a virtual object I' being sought. H is an object field, and $$r_1=|x_1(\xi,\eta)-x_0,y_1(\xi,\eta)-y_0,z_1(\xi,\eta)-z_0|, r_2=|x_2-x_0,y_2-y_0,z_2-z_0|, (x_0,y_0,z_0)$$

Is the solution of the problem of conditional optimization, where:

$$r_1+r_2 \to \min,$$

providing that the following condition $x_0^2+y_0^2+z_0^2=R^2$ is observed in the case of a spherical mirror, and the following condition $$\frac{x_0^2}{A^2} + \frac{y_0^2+z_0^2}{B^2} = 1$$

is observed in the case of a mirror in the form of an ellipse of revolution.

If the digital hologram is located between the mirror and the image, the reference wave field is also described by the following function:

$$O(\xi,\eta)=A(x(\xi,\eta),y(\xi,\eta),z(\xi,\eta))*e^{-i\varphi(x(\xi,\eta),y(\xi,\eta),z(\xi,\eta))}$$

The field of the object wave is searched according to the following formula:

$$\Pi(\xi,\eta) = \int\int_H \frac{e^{ikr}}{r} u(x_2,y_2,z_2)dx_2dy_2dz_2$$

where $u(x,y,z)$ is a field describing the virtual object (virtual image I') whose image is sought, and H is an object field, and.

$$r=|x_1(\xi,\eta)-x_2,y_1(\xi,\eta)-y_2,z_1(\xi,\eta)-z_2|$$

The greater the cell size in the hologram matrix the shorter the time needed for the synthesis which is inversely proportional to the cell area. However, the hologram transmission function has an explicitly expressed oscillatory nature. Therefore, if the chosen cell size is too big, a significant part of the information can be lost.

The minimal period for change in the grey function is:

$$T \approx \frac{\lambda d}{S}$$

where $\lambda$ is the wavelength of the used light, and S is an optical distance from focus of the reference spherical wave (point F) to the most remote point of the image I', i.e., an optical distance from the focus F to the digital hologram (DH). Quantitative experiments showed that is it sufficient to select the following step between the cells of the matrix:

$$\sigma = \frac{\lambda d}{4S} \approx \frac{T}{4}.$$

Further, distribution of the light transmission is approximated with the use of square openings in a non-transparent screen. Centers of these openings are arranged on a uniform rectangular matrix with a step σ. In the (ξ, η) coordinate system on the digital hologram, the coordinate of an opening with indices I and j will be the following: (σ(i−0.5), σ(j−0.5)). Dimensions of a square opening with indices I, J are calculated by the following formula:

$$\sqrt{\int_{\sigma(i-1)}^{\sigma i}\int_{\sigma(j-1)}^{\sigma j}T(\xi,\eta)d\xi d\eta}.$$

The digital hologram has a topology taking into an account correction of the aberration caused by the reflection of the light from the reflective concave curvilinear surface, irrespective either this is a spherical or an elliptical surface.

Although the invention has been described with reference to the specific drawings and description, it is understood that this description and drawings should not be construed as limiting the scope of the invention application and that any changes and modifications are possible without deviation from the spirit and scope of the attended claims. For example, a reflective concave curvilinear surface may be not necessarily semispherical or semielliptical and may be represented, e.g., by a surface which is semioval in a central cross-section.

The invention claimed is:

1. A system for generating a lithographic image comprising:
   a light source that emits a diverging light beam;
   a reflective concave curvilinear surface onto which the diverging light beam falls as an incident beam and which reflects the incident beam in a form of a converging beam;
   a digital hologram which has transverse dimensions, is placed in a path of the diverging light beam between the light source and the reflective concave curvilinear surface, and which is coded in accordance with the lithographic image for modulating the diverging light beam before the diverging light beam reaches the reflective concave curvilinear surface;
   a lithographic image restoration plane in a path of the converging beam; and
   an image-receiving substrate which is located in the image restoration plane and on which the lithographic image is generated.

2. The system of claim 1, wherein a light source is a coherent light source with a coherence length that exceeds the transverse dimensions of the digital hologram.

3. The system of claim 2, wherein the reflective concave curvilinear surface is selected from the group of reflective concave curvilinear surfaces which in vertical maximal diametrical cross sections are spherical reflective surfaces and elliptical reflective surfaces, the digital hologram having a topology taking into an account correction of an aberration caused by the reflection of the light from the reflective concave curvilinear surface.

4. The system of claim 3, wherein the digital hologram is a stationary digital hologram, which is pre-coded in accordance with the lithographic image to be generated on the image-receiving substrate.

5. The system of claim 3, wherein the digital hologram is a digital hologram which is dynamically controlled by using a spatial light modulator in accordance with the lithographic image to be generated on the image-receiving substrate.

6. The system of claim 5, further comprising a central processing unit connected to the spatial light modulator for coding the spatial light modulator with a code that corresponds to the lithographic image to be generated on the image-receiving substrate.

7. A method of generating a lithographic image comprising the steps of:
   providing a light source that emits a diverging light beam, a reflective concave curvilinear surface, a digital hologram between the light source and reflective concave curvilinear surface; and an image-receiving substrate on which the lithographic image is to be formed;
   providing the digital hologram with a code that corresponds to the lithographic image to be formed on the image-receiving substrate, emitting from the light source the diverging light beam, passing the diverging light beam to the reflective concave curvilinear surface through the digital hologram thus modifying the diverging light beam and forming a code-modulated beam on a way to the reflective concave curvilinear surface;
   reflecting the code-modulated beam from the reflective concave curvilinear surface to form a converging beam that carries a coded lithographic image and has an image restoration plane;
   placing the image-generation substrate in a path of the converging beam that carries a coded lithographic image; and
   forming the lithographic image on the image-generation substrate.

8. The method of claim 7, wherein the light emitted from the light source is a coherent light with a coherence length that exceeds transverse dimensions of the digital hologram.

9. The method of claim 8, wherein the reflective concave curvilinear surface is selected from the group of reflective concave curvilinear surfaces which in vertical maximal diametrical cross sections are semispherical reflective surfaces and elliptical reflective surfaces.

10. The method of claim 7, wherein in the step of providing the digital hologram said digital hologram is a stationary digital hologram which is pre-coded with a code that corresponds to the lithographic image.

11. The method of claim 10, wherein the light emitted from the light source is a coherent light with a coherence length that exceeds transverse dimensions of the digital hologram.

12. The method of claim 11, wherein the reflective concave curvilinear surface is selected from the group of reflective concave curvilinear surfaces which in vertical maximal diametrical cross sections are semispherical reflective surfaces and elliptical reflective surfaces.

13. The method of claim 7, wherein the digital hologram is coded dynamically in accordance with the lithographic image to be generated on the image-generation substrate by using a spatial light modulator.

14. The system of claim 13, further providing a central processing unit and using the central processing unit for forming the digital hologram by coding the spatial light modulator with a code that corresponds to the lithographic image to be generated on the image-receiving substrate.

15. The method of claim 14, wherein the light emitted from the light source is a coherent light with a coherence length that exceeds transverse dimensions of the digital hologram.

16. The method of claim 15, wherein the reflective concave curvilinear surface is selected from the group of reflective concave curvilinear surfaces which in vertical maximal diametrical cross sections are semispherical reflective surfaces and elliptical reflective surfaces.

\* \* \* \* \*